United States Patent
Yang et al.

(10) Patent No.: US 12,002,542 B2
(45) Date of Patent: *Jun. 4, 2024

(54) WRITE CIRCUIT OF MEMORY DEVICE AND METHOD OF OPERATING THE SAME

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Xiu-Li Yang, Shanghai (CN); Kuan Cheng, Shanghai (CN); He-Zhou Wan, Shanghai (CN); Wei-Yang Jiang, Jiangshan (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/074,392

(22) Filed: Dec. 2, 2022

(65) Prior Publication Data
US 2023/0105594 A1   Apr. 6, 2023

Related U.S. Application Data

(63) Continuation of application No. 17/229,676, filed on Apr. 13, 2021, now Pat. No. 11,521,662.

(30) Foreign Application Priority Data

Nov. 20, 2020 (CN) .......................... 202011311981.3

(51) Int. Cl.
  *G11C 8/00* (2006.01)
  *G11C 5/06* (2006.01)
  *G11C 7/10* (2006.01)
  *G11C 7/22* (2006.01)

(52) U.S. Cl.
  CPC .............. *G11C 7/222* (2013.01); *G11C 5/06* (2013.01); *G11C 7/106* (2013.01); *G11C 7/1087* (2013.01)

(58) Field of Classification Search
  CPC .................................................... G11C 7/222
  USPC ...................................................... 365/233.11
  See application file for complete search history.

(56) References Cited

U.S. PATENT DOCUMENTS

| | | | |
|---|---|---|---|
| 5,153,459 A | 10/1992 | Park et al. | |
| 8,190,808 B2 | 5/2012 | Lai et al. | |
| 8,976,607 B2 | 3/2015 | Desai | |
| 11,521,662 B2 * | 12/2022 | Yang | G11C 11/4085 |
| 2004/0090857 A1 | 5/2004 | Watanabe et al. | |
| 2012/0275246 A1 | 11/2012 | Kim | |
| 2015/0262646 A1 | 9/2015 | Cho | |

(Continued)

*Primary Examiner* — Hoai V Ho
(74) *Attorney, Agent, or Firm* — Maschoff Brennan

(57) ABSTRACT

A device includes a first memory bank and a second memory bank. The first memory bank is configured to operate according to a write data signal and a first global write signal associated with a first clock signal. The second memory bank is configured to operate according to the write data signal and a second global write signal associated with a second clock signal. One of the first clock signal and the second clock signal is in oscillation when another one of the first clock signal and the second clock signal is in suspension.

20 Claims, 7 Drawing Sheets

(56) References Cited

U.S. PATENT DOCUMENTS

2020/0110671 A1 4/2020 Woo et al.
2020/0272576 A1 8/2020 Haimzon et al.

* cited by examiner

WRITE CIRCUIT OF MEMORY DEVICE AND METHOD OF OPERATING THE SAME

CROSS-REFERENCE TO RELATED APPLICATION

This application is a continuation application of U.S. application Ser. No. 17/229,676, filed on Apr. 13, 2021, now U.S. Pat. No. 11,521,662, issued Dec. 6, 2022, which claims priority to China Application Serial Number 202011311981.3, filed Nov. 20, 2020, which is herein incorporated by reference.

BACKGROUND

Electronic equipment and electronic-based systems require some form of high-speed memory devices for storing and retrieving information. Random access memories (RAM) are commonly used in integrated circuits. Embedded RAM is particularly popular in high speed communication, image processing and system-on-chip (SOC) applications. A RAM incorporates an array of individual memory cells. A user may execute both read and write operations on the memory cells of a RAM. During a write procedure, a write driver is utilized to set up voltage levels on global signal wirings, which are connected to memory arrays in the memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
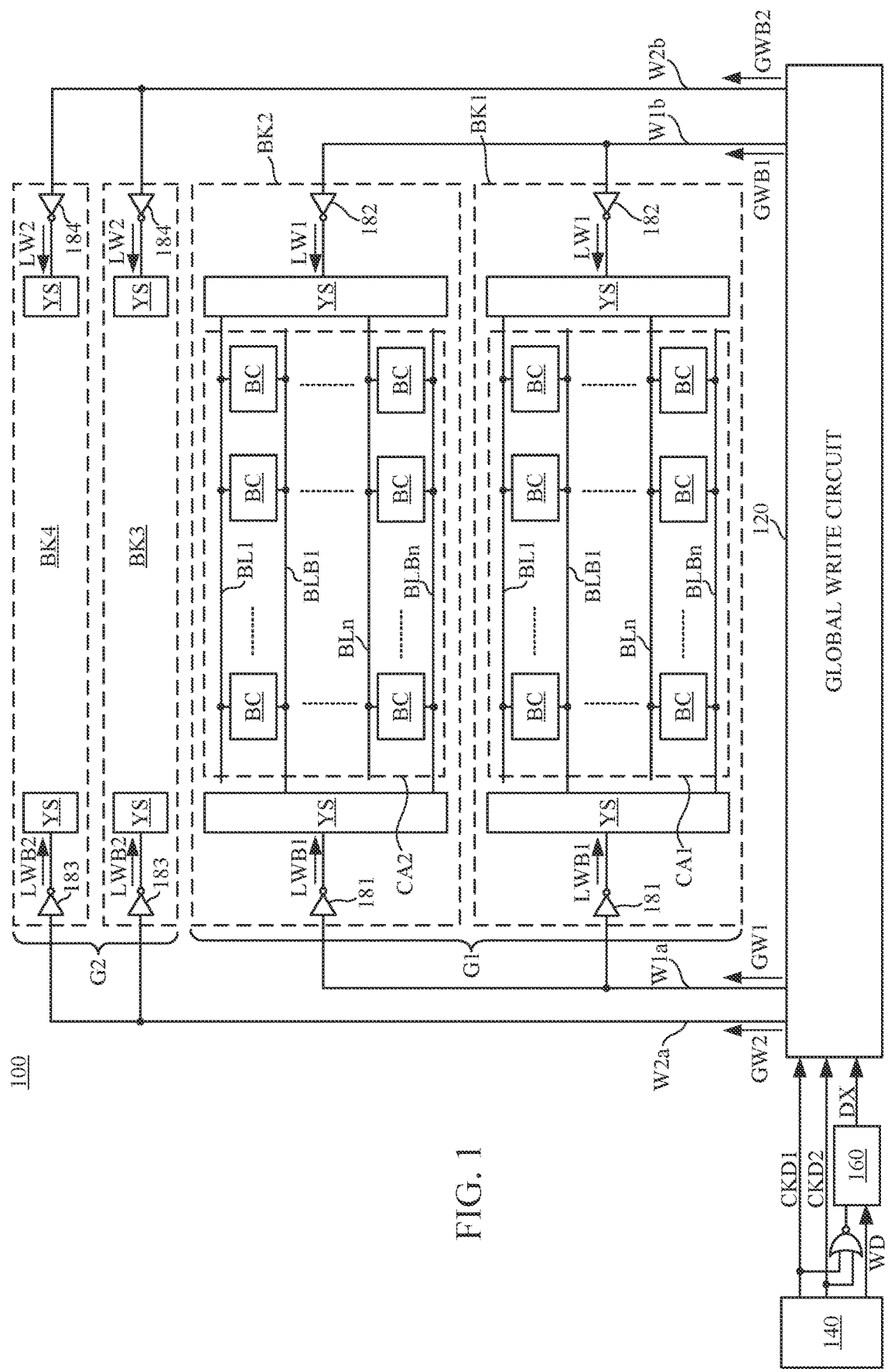
FIG. 1 is a schematic diagram illustrating a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

FIG. 1 is a schematic diagram illustrating a memory device 100 in accordance with various embodiments of the present disclosure. In embodiments illustratively shown in FIG. 1, the memory device 100 includes multiple memory banks BK1~BK4, and each of the memory banks BK1~BK4 can be accessed individually. These four memory banks BK1~BK4 in the memory device 100 are illustrated for demonstrational purpose, but the disclosure is not limited to four memory banks BK1~BK4. For example, the memory device 100 can include two, three, four, or more different memory banks.

In some embodiments, each one of the memory banks BK1~BK4 includes one memory array including several bit cells BC arranged on multiple rows and columns. As shown in the memory array CA1 of the memory bank BK1, these bit cells BC on the same column are connected to the same bit line and the same complement bit line. For example, the bit cells BC on the $1^{st}$ column are connected to the bit line BL1 and also the complement bit line BLB1, and the bit cells BC on the $n^{th}$ column are connected to the bit line BLn and the complement bit line BLBn. Similarly, as shown in the memory array CA2 of the memory bank BK2, these bit cells BC on the same column are connected to the same bit line and the same complement bit line. In some embodiments, the memory banks BK3 and BK4 also include structures similar to the memory banks BK1 and BK2. For brevity, internal structures of the memory banks BK3 and BK4 are not fully shown in FIG. 1.

As illustratively shown in FIG. 1, the memory device 100 includes a global write circuit 120, a control circuit 140, a data latch 160, a first pair of write data wirings W1a~W1b and a second pair of write data wirings W2a~W2b. The control circuit 140 is configured to provide a clock signal CKD1, another clock signal CKD2 and a write data signal WD.

Based on the clock signal CKD1, the clock signal CKD2 and the write data signal WD provided by the control circuit 140, the global write circuit 120 is configured to generate two signals selected from a global write signal GW1, a complement global write signal GWB1, another global write signal GW2 and another complement global write signal GWB2, so as perform a write procedure relative to one of the memory banks BK1~BK4. As shown in FIG. 1, the memory banks BK1~BK4 are arranged at different physical locations relative to the global write circuit 120 in the memory device 100. As illustratively shown in FIG. 1, the memory banks BK1~BK4 can be divided into two groups G1 and G2. The memory banks BK1 and BK2 in the first group G1 are relatively closer to the global write circuit 120, and the memory banks BK3 and BK4 in the second group G2 are relatively farer from the global write circuit 120. In some embodiments, the memory banks BK1 and BK2 in the first group G1 are connected to the first pair of write data wirings W1a and W1b, and the memory banks BK3 and BK4 in the second group G2 are connected to the second pair of write data wirings W2a and W2b.

In some embodiments, the global write circuit 120 is able to generate the global write signal GW1 and the complement global write signal GWB1 transmitted through the first pair of write data wirings W1a~W1b toward the memory banks BK1 and BK2 in the first group G1. On the other hand, the global write circuit 120 is also able to generate the global write signal GW2 and the complement global write signal GWB2 transmitted through the second pair of write data wirings W2a~W2b toward the memory banks BK3 and BK4 in the second group G2.

In some embodiments, during a single write procedure, only one memory bank among the memory banks BK1~BK4 is accessed by the memory device 100. In other words, the global write circuit 120 generates two of the four write-related signals (e.g., the global write signal GW1, the complement global write signal GWB1, the global write signal GW2 and the complement global write signal GWB2).

In an example, when the memory device 100 is configured to perform a write procedure to one bit cell BC in the memory bank BK1 (or BK2) in the first group G1, the global write circuit 120 is able to generate the global write signal GW1 and the complement global write signal GWB1 transmitted through the first pair of write data wirings W1a~W1b toward the memory bank BK1 (or BK2) in the first group G1. In some embodiments, a local write driver 181 in the memory bank BK1 (or BK2) is able to generate a complement local write signal LWB1 according to the global write signal GW1, and another local write driver 182 in the memory bank BK1 (or BK2) is able to generate a local write signal LW1 according to the complement global write signal GW1B. If a write target is in the memory bank BK1, one selection circuit YS in the memory bank BK1 is activated to pass the local write signal LW1 to one of bit lines BL1~BLn in the memory bank BK1, and another selection circuit YS in the memory bank BK1 is activated to pass the complement local write signal LW1B to one of complement bit lines BLB1~BLBn in the memory bank BK1. If a write target is in the memory bank BK2, one selection circuit YS in the memory bank BK2 is activated to pass the local write signal LW1 to one of bit lines BL1~BLn in the memory bank BK2, and another selection circuit YS in the memory bank BK2 is activated to pass the complement local write signal LW1B to one of complement bit lines BLB1~BLBn in the memory bank BK2.

On the other hand, when the memory device 100 is configured to perform a write procedure to one bit cell BC in the memory bank BK3 (or BK4) in the second group G2, the global write circuit 120 is able to generate the global write signal GW2 and the complement global write signal GWB2 transmitted through the second pair of write data wirings W2a~W2b toward the memory bank BK3 (or BK4) in the second group G2. Similar to aforesaid embodiments about the global write signal GW1 and the complement global write signal GWB1 in the memory bank BK1/BK2, the global write signal GW2 and the complement global write signal GWB2 is converted by the local write drivers 183 and 184 in in the memory bank BK3 (or BK4) into the complement local write signal LW2B and the local write signal LW2. The complement local write signal LW2B and the local write signal LW2 are passed by selection circuit YS in memory bank BK3 (or BK4) toward bit lines or complement bit lines (not shown in FIG. 1).

In some cases, if all of the memory banks in the memory device (e.g., the memory banks BK1~BK4 in the memory device 100 in embodiments shown in FIG. 1) are driven by the same pair of the global write signal and the complement global write signal through the same pair of the write data wirings, there is a heavy resistance-capacitance (RC) loading formed on the pair of the write data wirings, and the global write signal and the complement global write signal suffer different levels of distortion when these signals arrive different memory banks. For example, for the memory bank (e.g., the memory bank BK4 in embodiments shown in FIG. 1) which is far from the global write circuit, the global write signal and the complement local write signal can be seriously distorted, and this memory bank may not generate a functional pair of the local write signal and the complement local write signal accordingly, such that the write procedure to this memory bank may fail.

Compared to aforesaid cases that all of the memory banks in the memory device are driven through the same pair of the write data wirings, the memory banks BK1~BK4 of the memory device 100 in embodiments illustratively shown in FIG. 1 are divided into at least two groups G1 and G2. The memory banks BK1 and BK2 in the first group G1 are driven by the pair of the global write signal GW1 and the complement global write signal GWB1 through the first pair of the write data wirings W1a and W1b. The memory banks BK3 and BK4 in the second group G2 are driven by the pair of the global write signal GW2 and the complement global write signal GWB2 through the second pair of the write data wirings W2a and W2b. In other words, the memory device 100 includes separated pairs of the write data wirings (and also separated pairs of the global write signals and the complement global write signals) for the memory banks in different groups G1 and G2. Accordingly, the resistance-capacitance (RC) loading on each pair of the write data wirings is reduced. In this case, a writing speed to a memory bank in the memory device 100 can be increased.

In some embodiments, a capacitance on the write data wirings W1a and W1b connected to the memory banks BK1 and BK2 in the first group G1 can be reduced by about 50%, compared to write data wirings connected to all memory banks, because the write data wirings W1a and W1b are not required to extend far to reach the memory banks BK3 and BK4. In some embodiments, a capacitance on the write data wirings W2a and W2b connected to the memory banks BK3 and BK4 in the second group G2 can be reduced by about 10%, compared to write data wirings connected to all memory banks, because the write data wirings W2a and W2b are not required to connect with the memory banks B1 and B2 in the first group G1 on their way to reach the memory banks BK3 and BK4 in the second group G2.

In some embodiments, the control circuit 140 provides the clock signal CKD1, the clock signal CKD2 and the write data signal WD to control the global write circuit 120 in performing the write procedure. Further details about how the global write circuit 120 responses to the clock signal CKD1, the clock signal CKD2 and the write data signal WD will be discussed in the following paragraphs.

Figure 2:
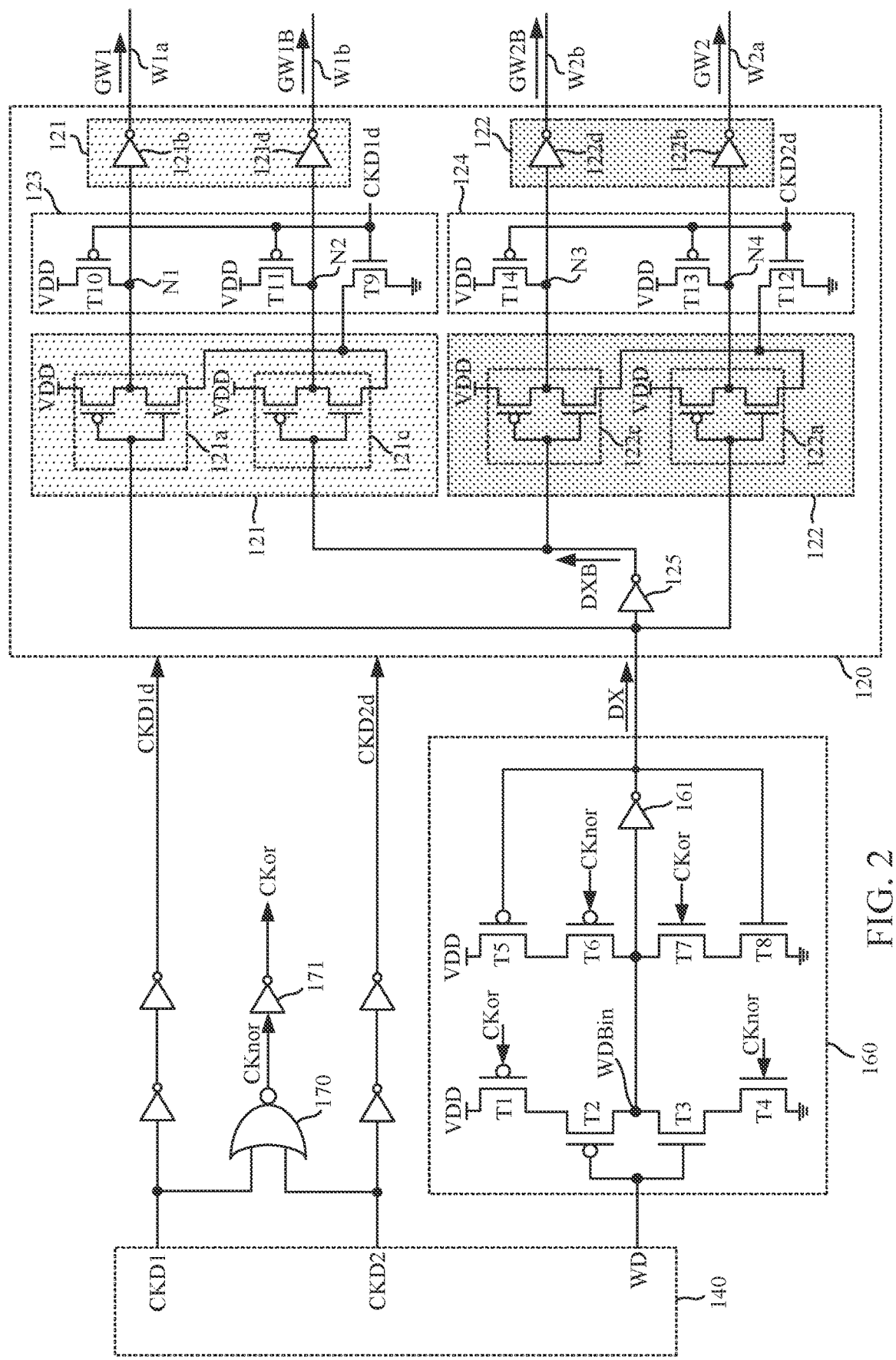
FIG. 2 is a schematic diagram illustrating circuitry structures of a global write circuit, a control circuit and a data latch in FIG. 1 in accordance with various embodiments of the present disclosure.
Figure 3:
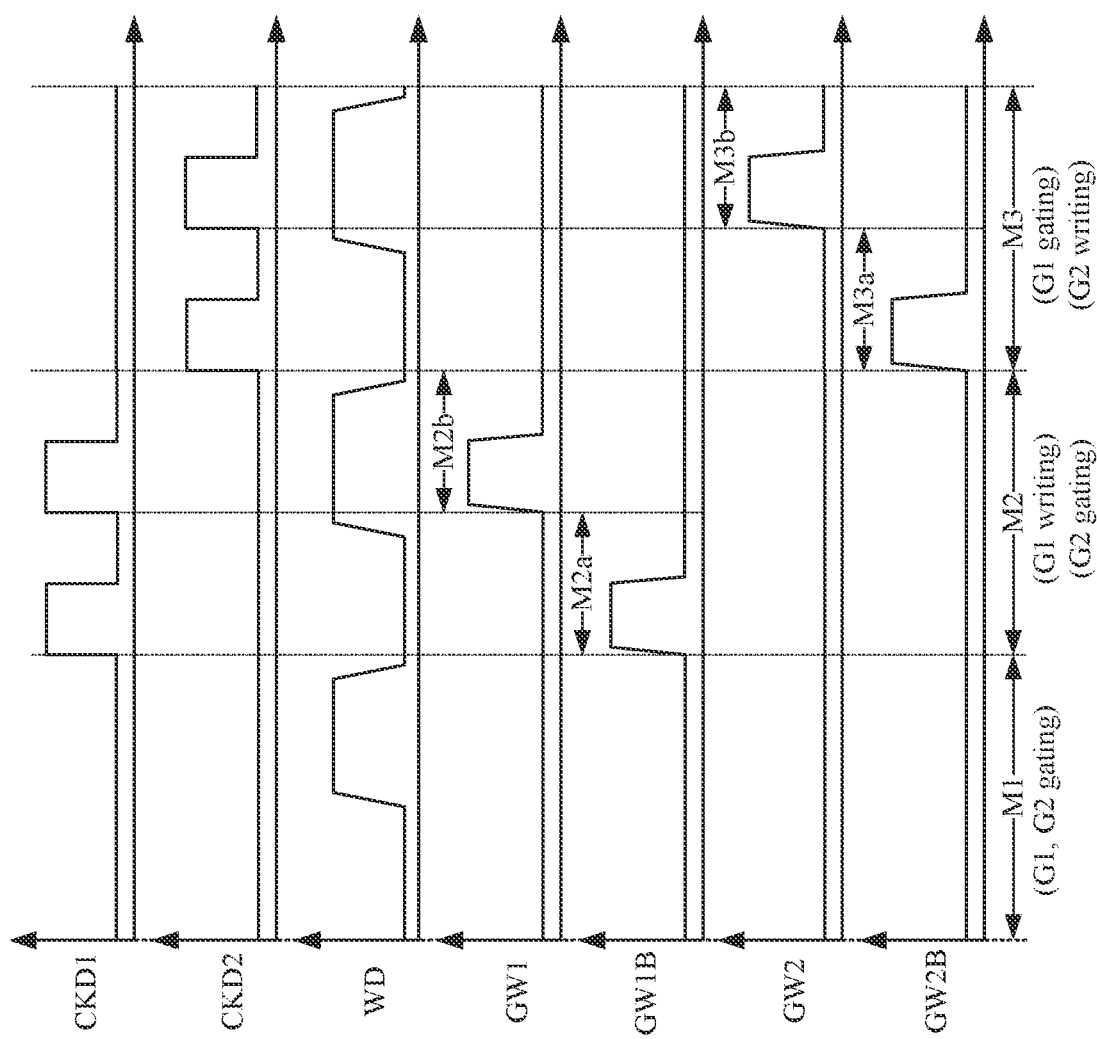
FIG. 3 is a signal waveform illustrating related signals generated in the memory device in FIG. 1 in accordance with various embodiments of the present disclosure.

FIG. 2 is a schematic diagram illustrating circuitry structures of the global write circuit 120, the control circuit 140 and the data latch 160 in FIG. 1 in accordance with various embodiments of the present disclosure. FIG. 3 is a signal waveform illustrating related signals generated in the memory device 100 in FIG. 1 in accordance with various embodiments of the present disclosure. With respect to the embodiments of FIG. 1, like elements in FIG. 2 and FIG. 3 are designated with the same reference numbers for ease of understanding.

As shown in FIG. 2, in some embodiments, the control circuit 140 provides the clock signal CKD1, the clock signal CKD2 and the write data signal WD. As shown in time period M2 in FIG. 3, when the write target is in the memory bank BK1 or BK2 in the first group G1, the control circuit 140 provides the clock signal CKD1 in oscillation (i.e., varying between a high level and a ground level) and the clock signal CKD2 in suspension (i.e., fixed at the ground level). On the other hand, as shown in time period M3 in FIG. 3, when the write target is in the memory bank BK3 or BK4 in the second group G2, the control circuit 140 provides the clock signal CKD2 in oscillation (i.e., varying between a high level and a ground level) and the clock signal CKD1 in suspension (i.e., fixed at the ground level).

The write data signal WD provided by the control circuit 140 defines bit data to be written into the target bit cell. When the write data signal WD is logic "1", the corresponding global write signal GW1 (referring to a time period M2b in FIG. 3) is charged to a high level or the corresponding global write signal GW2 (referring to a time period M3b in FIG. 3) is charged to a high level. When the write data signal WD is logic "0", the corresponding complement global write signal GWB1 (referring to a time period M2a in FIG. 3) is charged to a high level or the corresponding global write signal GWB2 (referring to a time period M3a in FIG. 3) is charged to a high level.

In some embodiments as shown in FIG. 2, the memory device 100 further includes a NOR-logic gate 170 and an inverter 171. The NOR-logic gate 170 and the inverter 171 are coupled between the control circuit 140 and the data latch 160. The NOR-logic gate 170 is configured to generate a clock signal CKnor according to the clock signal CKD1 and the clock signal CKD2. The inverter 171 is configured to invert the clock signal CKnor into another clock signal CKor. The clock signals CKnor and CKor are utilized to trigger the data latch 160. A relationship between the clock signal CKD1, the clock signal CKD2, the clock signal CKnor and the clock signal CKor are shown in following Table 1.

TABLE 1

| Clock Signal | CKD1 | CKD2 | CKnor | CKor |
| --- | --- | --- | --- | --- |
| Voltage Level | L | L | H | L |
| Voltage Level | L | H | L | H |
| Voltage Level | H | L | L | H |

As shown in FIG. 2, in some embodiments, the data latch 160 include eight transistors T1~T8 and an inverter 161. The transistors T1~T4 are coupled in series between a positive system power VDD and the ground. The transistors T5~T8 are coupled in series between a positive system power VDD and the ground. Gates of the transistors T1 and T7 are controlled by the clock signal CKor. Gates of the transistors T4 and T6 are controlled by the clock signal CKnor. Gates of the transistors T2 and T3 are controlled by the write data signal WD.

When the clock signal CKD1 and the clock signal CKD2 are both at "L" level, the clock signal CKor at "L" turns on the transistor T1 and the clock signal CKnor at "H" turns on the transistor T4, such that the write data signal WD is imported into the data latch 160 and stored as an inverted write signal WDBin. In embodiments shown in FIG. 2, the transistors T2 and T3 together function as an inverter, such that a voltage level of the inverted write signal WDBin is in an opposite logic relative to a voltage level of the write data signal WD. In the meantime, the transistors T6 is turned off by the clock signal CKnor at "H", and the transistors T7 is turned off by the clock signal CKor at "L", such that a latched write signal DX at an output terminal of the data latch 160 does not feedback to affect the inverted write signal WDBin stored in the data latch 160.

When one of the clock signal CKD1 and the clock signal CKD2 is at "H" level, the clock signal CKnor at "L" turns on the transistor T6 and the clock signal CKor at "H" turns on the transistor T7. In this case, the inverted write signal WDBin is inverted by the inverter 161 and outputted to the global write circuit 120 as a latched write signal DX. The latched write signal DX feeds back to the transistors T5 and T8 to enhance the inverted write signal WDBin stored in the data latch 160. In the meantime, the transistors T1 is turned off by the clock signal CKor at "H", and the transistors T4 is turned off by the clock signal CKnor at "L", such that write data signal WD at an input terminal of the data latch 160 is not imported into the data latch 160 and does not affect the inverted write signal WDBin.

In some embodiments, a voltage level of the latched write signal DX has the same logic as a voltage level of the write data signal WD. A voltage level of the inverted write signal WDBin is in an opposite logic relative to voltage levels of the write data signal WD and the latched write signal DX.

In some embodiments, as illustratively shown in FIG. 2, the clock signal CKD1 provided by the control circuit 140 is delayed by two cascaded inverters as a delayed clock signal CKD1d, which is transmitted to the global write circuit 120 for controlling a first gating circuit 123 in the global write circuit 120. Similarly, the clock signal CKD2 provided by the control circuit 140 is also delayed by two cascaded inverter as another delayed clock signal CKD2d, which is transmitted to the global write circuit 120 for controlling a second gating circuit 124 in the global write circuit 120.

However, the disclosure is not limited thereto. In some other embodiments, the clock signal CKD1 and the clock signal CKD2 can be directly transmitted to the global write circuit 120 for controlling the first gating circuit 123 and the second gating circuit 124 in the global write circuit 120 without delay. Or in still other embodiments, the clock signal CKD1 and the clock signal CKD2 can be delayed by more than two cascaded inverters before transmitting to the global write circuit 120. A delay chain upon the clock signal CKD1 and the clock signal CKD2 depends on a configuration of timing synchronization between the write data signal WD, the clock signal CKD1 and the clock signal CKD2 in practical applications.

As illustratively shown in FIG. 2, in some embodiments, the global write circuit 120 includes a first global write driver 121, a second global write driver 122, a first gating circuit 123, a second gating circuit 124 and an inverter 125. The inverter 125 is configured to generate an invert-latched write signal DXB has an opposite logic relative to the latched write signal DX.

In some embodiments, the first global write driver 121 is coupled between the data latch 160 and the first pair of write data wirings W1*a* and W1*b*. The first global write driver 121 is configured to generate the global write signal GW1 and the complement global write signal GWB1 according to the latched write signal DX stored in the data latch 160. The first global write driver 121 includes four inverters 121*a*~121*d*. The inverters 121*a* and 121*b* are coupled between the data latch 160 and the write data wiring W1*a*, for receiving latched write signal DX and accordingly generating the global write signal GW1. The inverters 121*c* and 121*d* are coupled between the inverter 125 and the write data wiring W1*b*, for receiving the invert-latched write signal DXB and accordingly generating the global write signal GW1B.

As illustratively shown in FIG. 2, the first gating circuit 123 is coupled with the first global write driver 121. During a write procedure to one of the memory banks BK1~BK2 in the first group G1, as shown in the time period M2 in FIG. 3, the clock signal CKD1 is oscillating between the high level and the ground level. When the clock signal CKD1 is oscillating to the high level, the corresponding delayed clock signal CKD1*d* turns on a transistor T9, which connects negative power terminals of the inverters 121*a* and 121*b* to the ground level, and also the corresponding delayed clock signal CKD1*d* turns off transistors T10 and T11 in the first gating circuit 123. During the write procedure to one of the memory banks BK1~BK2 in the first group G1, the latched write signal DX passes through the inverters 121*a* and 121*b* to the write data wiring W1*a*, and the invert-latched write signal DXB passes through the inverters 121*c* and 121*d* to the write data wiring W1*b*. As shown in the time period M2*a* in FIG. 3, when the write data signal WD is "L", the global write signal GW1 is fixed at "L" and the complement global write signal GW1B is oscillating between "H" and "L". As shown in the time period M2*b* in FIG. 3, when the write data signal WD is "H", the global write signal GW1 is oscillating between "H" and "L" and the complement global write signal GW1B is fixed at "L".

In some embodiments, the second global write driver 122 is coupled between the data latch 160 and the second pair of write data wirings W2*a* and W2*b*. The second global write driver 122 is configured to generate the global write signal GW2 and the complement global write signal GWB2 according to the latched write signal DX stored in the data latch 160. The second global write driver 122 includes four inverters 122*a*~122*d*. The inverters 122*a* and 122*b* are coupled between the data latch 160 and the write data wiring W2*a*, for receiving latched write signal DX and accordingly generating the global write signal GW2. The inverters 122*c* and 122*d* are coupled between the inverter 125 and the write data wiring W2*b*, for receiving the invert-latched write signal DXB and accordingly generating the global write signal GW2B.

As illustratively shown in FIG. 2, the second gating circuit 124 is coupled with the second global write driver 122. During a write procedure to one of the memory banks BK3~BK4 in the second group G2, as shown in the time period M3 in FIG. 3, the clock signal CKD2 is oscillating between the high level and the ground level. When the clock signal CKD2 is oscillating to the high level, the corresponding delayed clock signal CKD2*d* turns on a transistor T12, which connects negative power terminals of the inverters 122*a* and 122*b* to the ground level, and also the corresponding delayed clock signal CKD2*d* turns off transistors T13 and T14 in the second gating circuit 124. During the write procedure to one of the memory banks BK3~BK4 in the second group G2, the latched write signal DX passes through the inverters 122*a* and 122*b* to the write data wiring W2*a*, and the invert-latched write signal DXB passes through the inverters 122*c* and 122*d* to the write data wiring W2*b*. As shown in the time period M3*a* in FIG. 3, when the write data signal WD is "L", the global write signal GW2 is fixed at "L" and the complement global write signal GW2B is oscillating between "H" and "L". As shown in the time period M3*b* in FIG. 3, when the write data signal WD is "H", the global write signal GW2 is oscillating between "H" and "L" and the complement global write signal GW2B is fixed at "L".

It is notice that, during the write procedure to one of the memory banks BK1~BK2 in the first group G1, referring to the time period M2 in FIG. 3, the clock signal CKD2 is fixed at "L", such that the transistor T12 in the second gating circuit 124 is turned off to disconnect the negative power terminals of the inverters 122*a* and 122*b* from the ground level, and also the transistors T13 and T14 in the second gating circuit 124 are turned on to pull up the voltage levels on nodes N3 and N4 to the positive system power VDD. In this case, referring to FIG. 2 and FIG. 3, during the time period M2, the second gating circuit 124 is configured to disable the second global write driver 122 (by disconnecting the negative power terminals of the inverters 122*a* and 122*b* from the ground level) and maintain the second pair of write data wirings W2*a* and W2*b* at the ground level (by fixing the voltage levels on the nodes N3 and N4 to the positive system power VDD). In other words, while the write procedure is performing to one of the memory banks BK1~BK2 in the first group G1, the second gating circuit 124 activates to perform gating on the second global write driver 122 corresponding to the memory banks BK3~BK4 in the second group G2.

On the other hand, during the write procedure to one of the memory banks BK3~BK4 in the second group G2, referring to the time period M3 in FIG. 3, the clock signal CKD1 is fixed at "L", such that the transistor T9 in the first gating circuit 123 is turned off to disconnect the negative power terminals of the inverters 121*a* and 121*b* from the ground level, and also the transistors T10 and T11 in the first gating circuit 123 are turned on to pull up the voltage levels on nodes N1 and N2 to the positive system power VDD. In this case, referring to FIG. 2 and FIG. 3, during the time period M3, the first gating circuit 123 is configured to disable the first global write driver 121 (by disconnecting the negative power terminals of the inverters 121a and 121b from the ground level) and maintain the first pair of write data wirings W1a and W1b at the ground level (by fixing the voltage levels on the nodes N1 and N2 to the positive system power VDD). In other words, while the write procedure is performing to one of the memory banks BK3~BK4 in the second group G2, the first gating circuit 123 activates to perform gating on the first global write driver 121 corresponding to the memory banks BK1~BK2 in the first group G1.

Based on aforesaid embodiments, the first global write driver 121 and the second global write driver 122 function in response to the same write data signal WD from the control circuit 140. As shown in FIG. 2, the first global write driver 121 and the second global write driver 122 receive the same latched write signal DX from the same data latch 160. In some embodiments, the first global write driver 121 and the second global write driver 122 activate separately in response to different clock signals. The first global write driver 121 activates in response to the delayed clock signal CKD1d, and the second global write driver 122 activates in response to the delayed clock signal CKD2d.

Referring to FIG. 2 and the time period M1 in FIG. 3, when there is no write procedure to any memory banks BK1~BK4 in the two groups, the control circuit 140 can provide the clock signals CKD1 and CKD2 which are both fixed at "L", such that both of the first gating circuit 123 and the second gating circuit 124 activate to fix the global write signals GW1/GW2 and the complement global write signals GW1B/GW2B at "L".

In aforesaid embodiments shown in FIG. 1, the memory device 100 includes four memory banks BK1~BK4 in two groups G1 and G2. The first group G1 including two memory banks BK1 and BK2 shares the same pair of the write data wirings W1a and W1b. The second group G2 including two memory banks BK3 and BK4 shares the same pair of the write data wirings W2a and W2b. However, the disclosure is not limited thereto.

In some embodiments, the first group G1 can include N memory banks and the second group G2 can include another N memory banks. N is a positive integer larger than or equal to 2. For example, there can be 2, 3, 4 or more memory banks in each one of the first group G1 and the second group G2.

Figure 4:
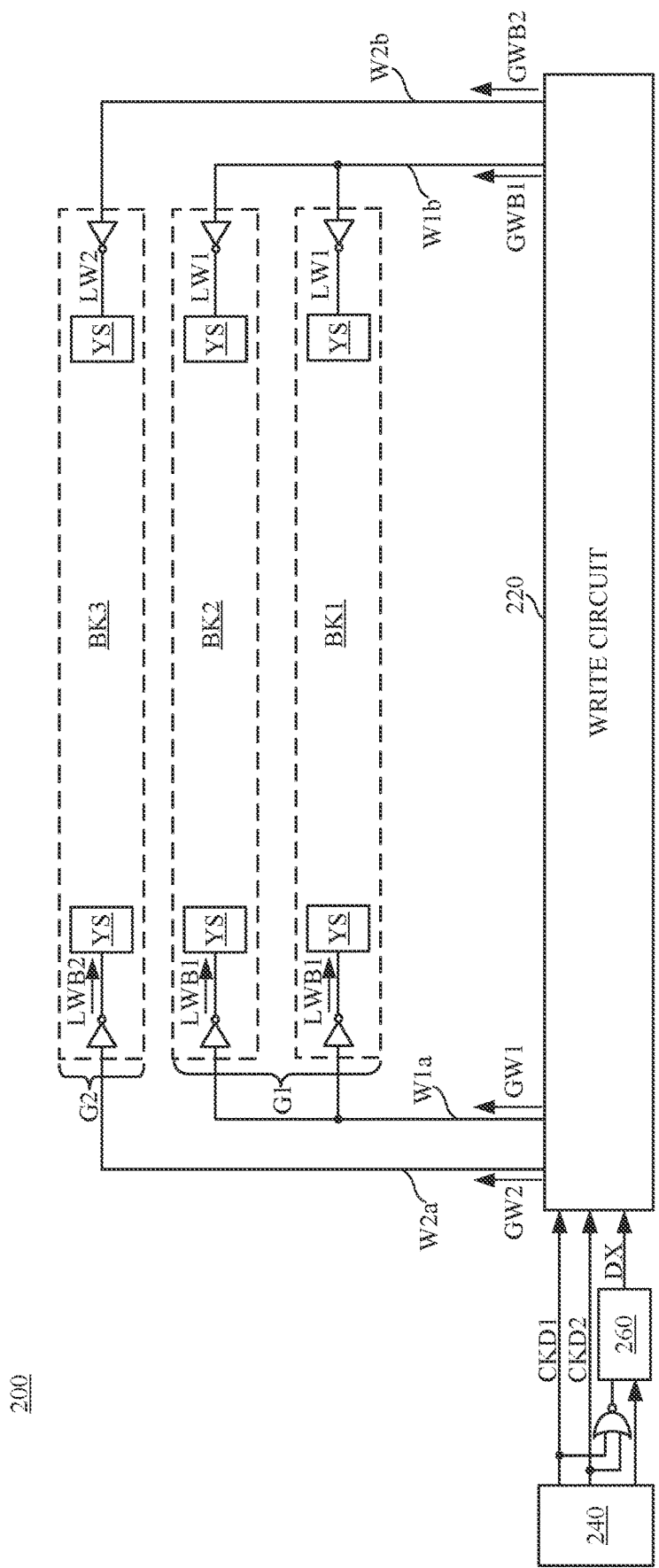
FIG. 4 is a schematic diagram illustrating a memory device in accordance with various embodiments of the present disclosure.

Reference is further made to FIG. 4, which is a schematic diagram illustrating a memory device 200 in accordance with various embodiments of the present disclosure. With respect to the embodiments of FIG. 1, like elements in FIG. 4 are designated with the same reference numbers for ease of understanding.

In embodiments illustratively shown in FIG. 4, the memory device 200 includes multiple memory banks BK1~BK3, and each of the memory banks BK1~BK3 can be accessed individually. These three memory banks BK1~BK3 in the memory device 200 are illustrated for demonstrational purpose. Internal structures in each of the memory banks BK1~BK3 in FIG. 4 are similar to the internal structures in each of the memory banks BK1~BK4 in FIG. 1, and can be referred to embodiments discussed about the memory bank BK1 or BK2 in the memory device 100 along with FIG. 1.

In some embodiments, each one of the memory banks BK1~BK3 includes one memory array including several bit cells (not shown in FIG. 4, can be referred to FIG. 1) arranged on multiple rows and columns. For brevity, internal structures of the memory banks BK1~BK3 are not fully shown in FIG. 4.

As illustratively shown in FIG. 4, the memory device 200 includes a global write circuit 220, a control circuit 240, a data latch 260, a first pair of write data wirings W1a~W1b and a second pair of write data wirings W2a~W2b. The control circuit 240 is configured to provide a clock signal CKD1, another clock signal CKD2 and a write data signal WD. Functions and behaviors of the global write circuit 220, the control circuit 240 and the data latch 260 in the memory device 200 in FIG. 4 are similar to the global write circuit 120, the control circuit 140, the data latch 160 in the memory device 100 along with FIG. 1 discussed in aforesaid embodiments.

Based on the clock signal CKD1, the clock signal CKD2 and the write data signal WD provided by the control circuit 240, the global write circuit 220 is configured to generate two signals selected from a global write signal GW1, a complement global write signal GWB1, another global write signal GW2 and another complement global write signal GWB2, so as perform a write procedure relative to one of the memory banks BK1~BK3. As shown in FIG. 4, the memory banks BK1~BK3 are arranged at different physical locations relative to the global write circuit 220 in the memory device 200. As illustratively shown in FIG. 4, the memory banks BK1~BK3 can be divided into two groups G1 and G2. The memory banks BK1 and BK2 in the first group G1 are relatively closer to the global write circuit 220, and the memory bank BK3 in the second group G2 are relatively farer from the global write circuit 220. In some embodiments, the memory banks BK1 and BK2 in the first group G1 are connected to the first pair of write data wirings W1a and W1b, and the memory bank BK3 in the second group G2 are connected to the second pair of write data wirings W2a and W2b.

In some embodiments, the memory device 200 includes three memory banks BK1~BK3 divided into two groups G1 and G2. In embodiments, the groups G1 and G2 do not have equal amount of memory banks, because the total amount of the memory banks BK1~BK3 is an odd number. In embodiments shown in FIG. 4, two memory banks BK1 and BK2 located closer to the global write circuit 220 are classified into the first group G1, and one memory bank BK3 located farer from the global write circuit 220 is classified into the second group G2. In this case, the capacitance on the write data wirings W1a and W1b (with a shorter length and connected to two memory banks) tends to be more balanced with the capacitance on the write data wirings W2a and W2b (with a longer length and connected to one memory bank).

In some other embodiments, the memory bank BK1 can be classified into the first group G1, and two memory banks BK2 and BK3 located farer from the global write circuit 220 can be classified into the second group G2. In this case, the resistance-capacitance (RC) loading on each pair of the write data wirings (e.g., W1a/W1b and W2a/W2b) can still be reduced, compared to linking all of the memory banks BK1~BK3 with the same pair of the write data wirings. In this case, a writing speed to a memory bank in the memory device 200 can be increased.

Figure 5:
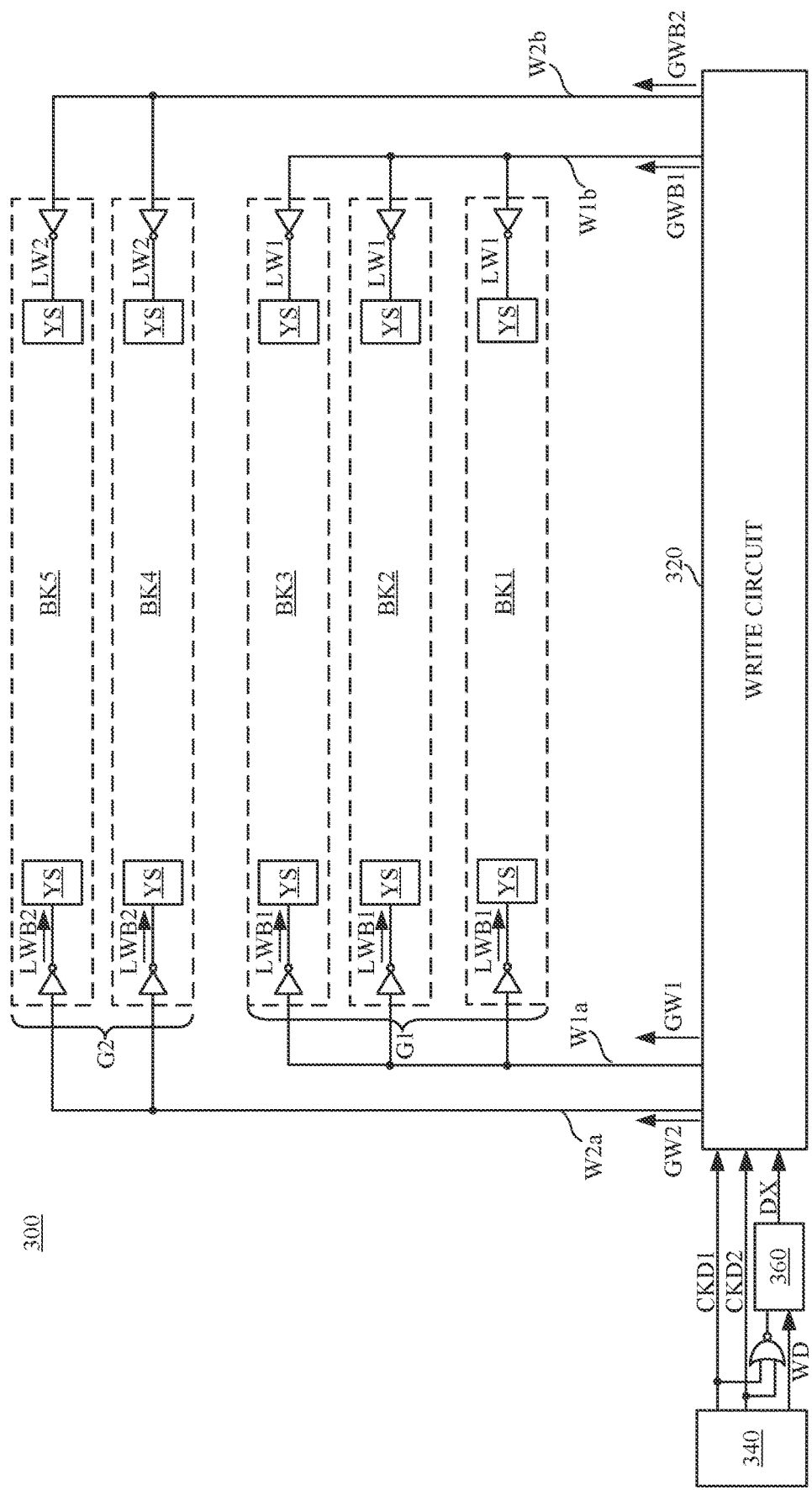
FIG. 5 is a schematic diagram illustrating a memory device in accordance with various embodiments of the present disclosure.

Reference is further made to FIG. 5, which is a schematic diagram illustrating a memory device 300 in accordance with various embodiments of the present disclosure. With respect to the embodiments of FIG. 1 and FIG. 4, like elements in FIG. 5 are designated with the same reference numbers for ease of understanding.

In embodiments illustratively shown in FIG. 5, the memory device 300 includes multiple memory banks BK1~BK5, and each of the memory banks BK1~BK5 can be accessed individually. These five memory banks BK1~BK5 in the memory device 300 are illustrated for demonstrational purpose. Internal structures in each of the memory banks BK1~BK5 in FIG. 5 are similar to the internal structures in each of the memory banks BK1~BK4 in FIG. 1, and can be referred to embodiments discussed about the memory bank BK1 or BK2 in the memory device 100 along with FIG. 1.

In some embodiments, each one of the memory banks BK1~BK5 includes one memory array including several bit cells (not shown in FIG. 5, can be referred to FIG. 1) arranged on multiple rows and columns. For brevity, internal structures of the memory banks BK1~BK5 are not fully shown in FIG. 5.

As illustratively shown in FIG. 5, the memory device 300 includes a global write circuit 320, a control circuit 340, a data latch 360, a first pair of write data wirings W1a~W1b and a second pair of write data wirings W2a~W2b. The control circuit 340 is configured to provide a clock signal CKD1, another clock signal CKD2 and a write data signal WD. Functions and behaviors of the global write circuit 320, the control circuit 340 and the data latch 360 in the memory device 300 in FIG. 5 are similar to the global write circuit 120, the control circuit 140, the data latch 160 in the memory device 100 along with FIG. 1 discussed in aforesaid embodiments.

Based on the clock signal CKD1, the clock signal CKD2 and the write data signal WD provided by the control circuit 340, the global write circuit 320 is configured to generate two signals selected from a global write signal GW1, a complement global write signal GWB1, another global write signal GW2 and another complement global write signal GWB2, so as to perform a write procedure relative to one of the memory banks BK1~BK5. As shown in FIG. 5, the memory banks BK1~BK5 are arranged at different physical locations relative to the global write circuit 320 in the memory device 300. As illustratively shown in FIG. 5, the memory banks BK1~BK5 can be divided into two groups G1 and G2. The memory banks BK1~BK3 in the first group G1 are relatively closer to the global write circuit 320, and the memory banks BK4-BK5 in the second group G2 are relatively farer from the global write circuit 320. In some embodiments, the memory banks BK1~BK3 in the first group G1 are connected to the first pair of write data wirings W1a and W1b, and the memory banks BK4-BK5 in the second group G2 are connected to the second pair of write data wirings W2a and W2b.

In some embodiments, the memory device 300 includes five memory banks BK1~BK5 divided into two groups G1 and G2. In some other embodiments, the groups G1 and G2 do not have equal amount of memory banks, because the total amount of the memory banks BK1~BK5 is an odd number. In embodiments shown in FIG. 5, three memory banks BK1~BK3 located closer to the global write circuit 320 are classified into the first group G1, and two memory banks BK4-BK5 located farer from the global write circuit 320 is classified into the second group G2. In this case, the capacitance on the write data wirings W1a and W1b (with a shorter length and connected to three memory banks) tends to be more balanced with the capacitance on the write data wirings W2a and W2b (with a longer length and connected to two memory banks).

In this case, the resistance-capacitance (RC) loading on each pair of the write data wirings (e.g., W1a/W1b and W2a/W2b) can be reduced, compared to linking all of the memory banks BK1~BK5 with the same pair of the write data wirings. In this case, a writing speed to a memory bank in the memory device 300 can be increased.

Based on embodiments, shown in FIG. 4 and FIG. 5, when there are total 2M+1 memory banks in one memory device, M+1 memory banks among them closer to the global write circuit can be divided into one group (e.g., the first group G1 in FIG. 4 or FIG. 5) and other M memory banks among them farer from the global write circuit can be divided into another group (e.g., the second group G2 in FIG. 4 or FIG. 5). M is a positive integer larger than or equal to 1. In this case, the capacitances can be more balanced on different pairs of write data wirings connected to different groups of memory banks.

Figure 6:
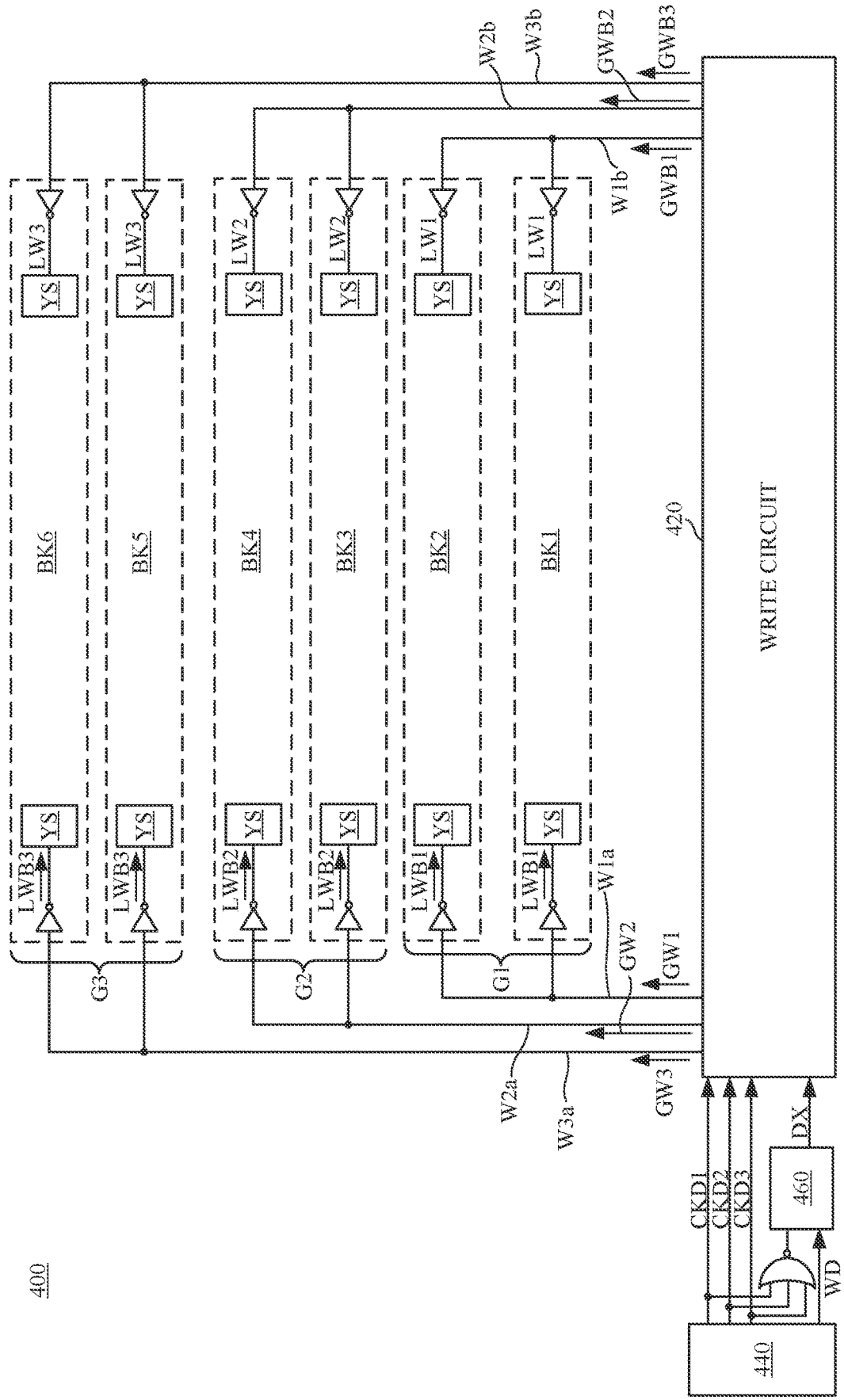
FIG. 6 is a schematic diagram illustrating a memory device in accordance with various embodiments of the present disclosure.

In aforesaid embodiments in FIG. 1 to FIG. 5, the memory banks are divided into two groups. However, the disclosure is not limited to divide the memory banks into two groups. Reference is further made to FIG. 6, which is a schematic diagram illustrating a memory device 400 in accordance with various embodiments of the present disclosure. With respect to the embodiments of FIG. 1, FIG. 4 and FIG. 5, like elements in FIG. 6 are designated with the same reference numbers for ease of understanding.

In embodiments illustratively shown in FIG. 6, the memory device 400 includes multiple memory banks BK1~BK6, and each of the memory banks BK1~BK6 can be accessed individually. Internal structures in each of the memory banks BK1~BK6 in FIG. 6 are similar to the internal structures in each of the memory banks BK1~BK4 in FIG. 1, and can be referred to embodiments discussed about the memory bank BK1 or BK2 in the memory device 100 along with FIG. 1.

In some embodiments, each one of the memory banks BK1~BK6 includes one memory array including several bit cells (as shown in embodiments in FIG. 1) arranged on multiple rows and columns. For brevity, internal structures of the memory banks BK1~BK6 are not fully shown in FIG. 6.

As illustratively shown in FIG. 6, the memory device 400 includes a global write circuit 420, a control circuit 440, a data latch 460, a first pair of write data wirings W1a-W1b, a second pair of write data wirings W2a~W2b and a third pair of write data wirings W3a~W3b. The control circuit 440 is configured to provide a clock signal CKD1, another clock signal CKD2, still another clock signal CKD3 and a write data signal WD. Functions and behaviors of the global write circuit 420, the control circuit 440 and the data latch 460 in the memory device 400 in FIG. 6 are similar to the global write circuit 120, the control circuit 140, the data latch 160 in the memory device 100 along with FIG. 1 discussed in aforesaid embodiments.

Based on the clock signal CKD1, the clock signal CKD2, the clock signal CKD3 and the write data signal WD provided by the control circuit 440, the global write circuit 420 is configured to generate two signals selected from a global write signal GW1, a complement global write signal GWB1, another global write signal GW2, another complement global write signal GWB2, still another global write signal GW2 and still another complement global write signal GWB3, so as to perform a write procedure relative to one of the memory banks BK1~BK6. As shown in FIG. 6, the memory banks BK1~BK6 are arranged at different physical locations relative to the global write circuit 420 in the memory device 400. As illustratively shown in FIG. 6, the memory banks BK1~BK6 can be divided into three groups G1-G3. The memory banks BK1 and BK2 in the first group G1 are relatively closer to the global write circuit 420; the memory banks BK3 and BK4 in the second group G2 are relatively farer from the global write circuit 420; the memory banks BK5 and BK6 in the third group G3 are the farthest from the global write circuit 420. In some embodiments, the memory banks BK1 and BK2 in the first group G1 are connected to the first pair of write data wirings W1a and W1b; the memory banks BK3 and BK4 in the second group G2 are connected to the second pair of write data wirings W2a and W2b; the memory banks BK5 and BK6 in the third group G3 are connected to the third pair of write data wirings W3a and W3b.

The global write circuit 420 is configured to receive the clock signals CKD1~CKD3 from the control circuit 440. In response to the clock signal CKD1, the global write circuit 420 generates a global write signal GW1 and a complement global write signal GWB1 transmitted to the first group G1 through the first pair of write data wirings W1a and W1b, and in the meantime the global write signals GW2~GW3 and the complement global write signals GWB2~GWB3 are fixed at the ground level. In response to the clock signal CKD2, the global write circuit 420 generates another global write signal GW2 and a complement global write signal GWB2 transmitted to the second group G2 through the second pair of write data wirings W2a and W2b, and in the meantime the global write signals GW1 and GW3 and the complement global write signals GWB1 and GWB3 are fixed at the ground level. In response to the clock signal CKD3, the global write circuit 420 generates another global write signal GW3 and a complement global write signal GWB3 transmitted to the third group G3 through the third pair of write data wirings W3a and W3b, and in the meantime the global write signals GW1~GW2 and the complement global write signals GWB1~GWB2 are fixed at the ground level. Details structures in the global write circuit 420 in FIG. 6 are can be referred to the global write circuit 120 in the embodiments shown in FIG. 2. The difference between the global write circuit 420 and the global write circuit 120 is that the global write circuit 420 includes three sets of global write drivers and three sets of the gating circuits for generating the global write signals GW1~GW3 and the complement global write signals GWB1~GWB3 separately.

In this case, the resistance-capacitance (RC) loading on each pair of the write data wirings (e.g., W1a/W1b, W2a/W2b and W3a/W3b) can be reduced, compared to linking all of the memory banks BK1~BK6 with the same pair of the write data wirings. In this case, a writing speed to a memory bank in the memory device 400 can be increased.

As the memory device 400 shown in FIG. 6, when the memory device 400 include more memory banks (e.g., the memory banks BK1~BK6), these memory banks can be divided in more groups. In some other embodiments, the memory device can include two, three, four or more groups of memory banks, and each of aforesaid groups can include one, two, three or more memory banks. The global write circuit is configured to provide different sets of the global write signals and the complement global write signals for different groups separately.

Figure 7:
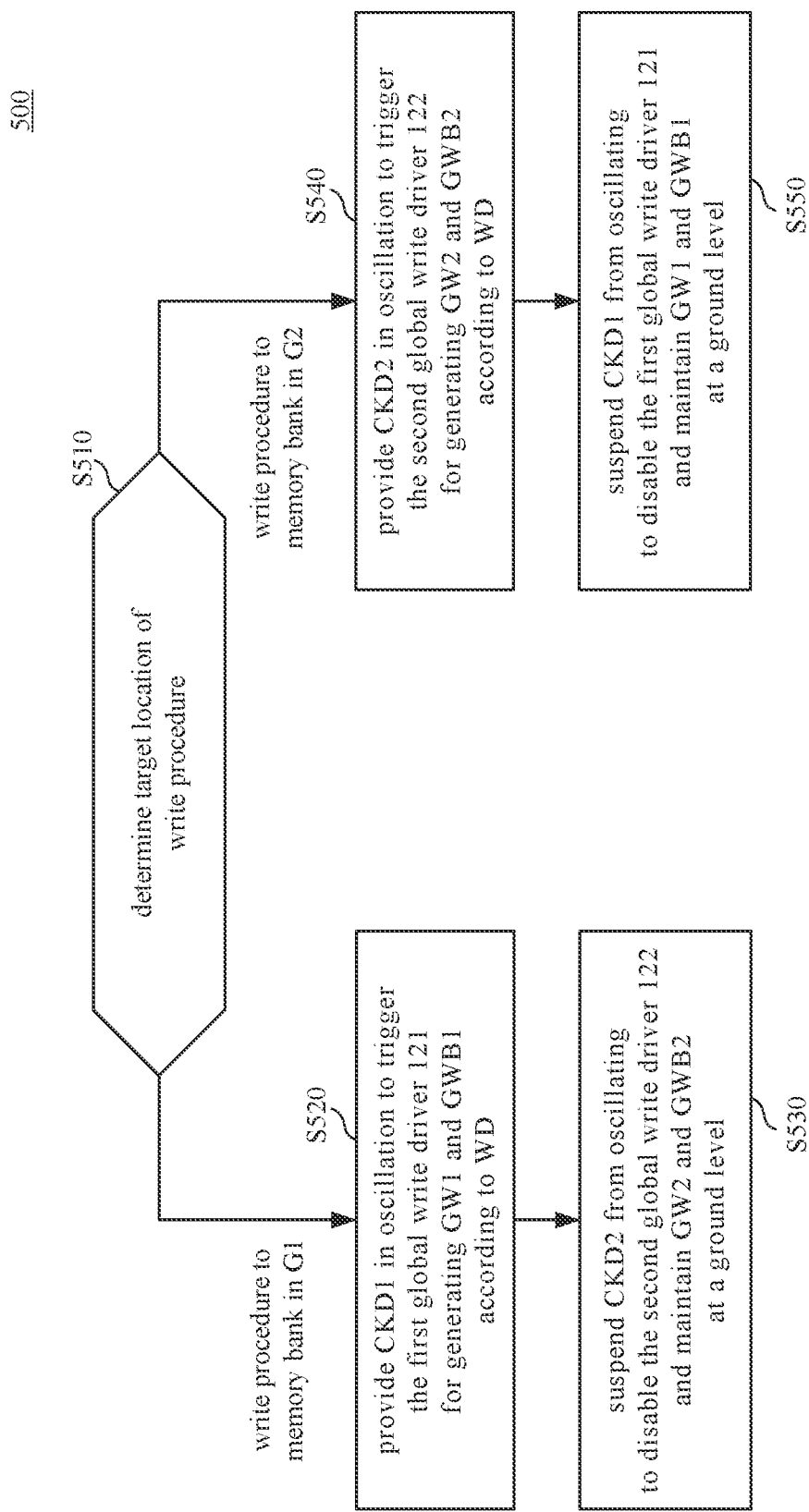
FIG. 7 is a flow chart diagram illustrating a method in accordance with various embodiments of the present disclosure.

Reference is further made to FIG. 7, which is a flow chart diagram illustrating a method 500 in accordance with various embodiments of the present disclosure. The method 500 can be utilized on the memory device 100~400 of aforesaid embodiments shown in FIG. 1 to FIG. 6. For brevity, in the following paragraphs, the method 500 in FIG. 7 is discussed along with the memory device 100 of embodiments shown in FIG. 1 to FIG. 3.

Operation S510 is performed, by the control circuit 140, to determine a target location of a write procedure. For example, the target location may include a memory bank identification, a row address and a column address. The memory bank identification indicates that a target bit cell of the write procedure is located at which one of the memory banks BK1~BK4. If the write procedure targets to write into a bit cell in one of the memory banks BK1~BK2 in the first group G1, operations S520 and S530 are performed. On the other hand, if the write procedure targets to write into a bit cell in one of the memory banks BK3~BK4 in the second group G2, operations S540 and S550 are performed.

In operation S520, during the write procedure to write into one of the memory banks BK1~BK2 in the first group G1, the control circuit 140 provides the clock signal CKD1 in oscillation to trigger the first global write driver 121 in the global write circuit 120 for generating the global write signal GW1 and the complement global write signal GW1B according to the write data signal WD. While the clock signal CKD1 in oscillating, the first gating circuit 123 in the global write circuit 120 is configured to enable the first global write driver 121 in the global write circuit 120 to generates the global write signal GW1 and the complement global write signal GWB1. Further details about the generation of the global write signal GW1 and the complement global write signal GW1B are discussed in embodiments about the global write circuit 120 in FIG. 2 and also in embodiments about time period M2 in FIG. 3, and those details are not repeated here again.

In operation S530, during the write procedure to write into one of the memory banks BK1~BK2 in the first group G1, the control circuit 140 suspended the clock signal CKD2 from oscillating (e.g., the clock signal CKD2 is fixed at the ground level), so as to disable the second global write driver 122 by the second gating circuit 124. In this case, voltage levels on the second pair of write data wirings W2a and W2b connected with the second global write driver 122 are maintained at the ground level.

In operation S540, during the write procedure to write into one of the memory banks BK3~BK4 in the second group G2, the control circuit 140 provides the clock signal CKD2 in oscillation to trigger the second global write driver 122 in the global write circuit 120 for generating the global write signal GW2 and the complement global write signal GW2B according to the write data signal WD. While the clock signal CKD2 in oscillating, the second gating circuit 124 in the global write circuit 120 is configured to enable the second global write driver 122 in the global write circuit 120 to generates the global write signal GW2 and the complement global write signal GWB2. Further details about the generation of the global write signal GW2 and the complement global write signal GW2B are discussed in embodiments about the global write circuit 120 in FIG. 2 and also in embodiments about time period M3 in FIG. 3, and those details are not repeated here again.

In operation S550, during the write procedure to write into one of the memory banks BK3~BK4 in the second group G2, the control circuit 140 suspended the clock signal CKD1 from oscillating (e.g., the clock signal CKD1 is fixed at the ground level), so as to disable the first global write driver 121 by the first gating circuit 123. In this case, voltage levels on the first pair of write data wirings W1a and W1b connected with the first global write driver 121 are maintained at the ground level.

Also disclosed is a device. The device includes a first memory bank and a second memory bank. The first memory bank is configured to operate according to a write data signal and a first global write signal associated with a first clock signal. The second memory bank is configured to operate according to the write data signal and a second global write signal associated with a second clock signal. One of the first clock signal and the second clock signal is in oscillation when another one of the first clock signal and the second clock signal is in suspension.

Also disclosed is a device. The device includes a data latch, a first logic element, a second logic element and memory banks. The data latch is configured to receive a first clock signal and a second clock signal, and generate a write signal. The first logic element is configured to generate the second clock signal based on the first clock signal. The second logic element is configured to generate the first clock signal based on a third clock signal and a fourth clock signal that are different from each other. The memory banks are configured to operate according to the write signal, the third clock signal and the fourth clock signal.

Also disclosed is a method. The method includes: generating a first global write signal based on a first clock signal and a write data signal; driving a first memory bank by the first global write signal; generating a second global write signal based on a second clock signal and the write data signal; driving a second memory bank by the second global write signal; generating a third global write signal based on a third clock signal and the write data signal; and driving a third memory bank by the third global write signal. The first clock signal, the second clock signal and the third clock signal are different from each other, and the first memory bank, the second memory bank and the third memory bank are different from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a data latch configured to receive a first clock signal and a second clock signal, and generate a write signal according to a write data signal inputted to the data latch;
   a first logic element configured to generate the second clock signal based on the first clock signal;
   a second logic element configured to generate the first clock signal based on a third clock signal and a fourth clock signal that are different from each other; and
   a plurality of memory banks configured to operate according to the write signal, the third clock signal and the fourth clock signal.

2. The device of claim 1, further comprising:
   a third logic element configured to provide a first global write signal associated with the third clock signal to one of the plurality of memory banks; and
   a fourth logic element configured to provide a second global write signal associated with the fourth clock signal to another one of the plurality of memory banks.

3. The device of claim 2, further comprising:
   a fifth logic element configured to receive the write signal, and coupled in series with the third logic element at a first node;
   a sixth logic element configured to receive the write signal, and coupled in series with the fourth logic element at a second node;
   a first switch coupled to the first node and configured to be controlled by the third clock signal; and
   a second switch coupled to the second node and configured to be controlled by the fourth clock signal.

4. The device of claim 1, further comprising:
   a third logic element configured to receive the write signal;
   a fourth logic element configured to receive the write signal;
   a first switch configured to adjust a voltage level of an output terminal of the third logic element according to the third clock signal; and
   a second switch configured to adjust a voltage level of an output terminal of the fourth logic element according to the fourth clock signal.

5. The device of claim 1, further comprising:
   a third logic element configured to receive the write signal;
   a fourth logic element configured to receive the write signal;
   a first switch configured to adjust a voltage level of a power terminal of the third logic element according to the third clock signal; and
   a second switch configured to adjust a voltage level of a power terminal of the fourth logic element according to the fourth clock signal.

6. The device of claim 5, further comprising:
   an inverter configured to receive the write signal to generate an inverted write signal;
   a fifth logic element configured to receive the inverted write signal; and
   a sixth logic element configured to receive the inverted write signal;
   wherein the first switch is further configured to adjust a voltage level of a power terminal of the fifth logic element according to the third clock signal; and
   the second switch is further configured to adjust a voltage level of a power terminal of the sixth logic element according to the fourth clock signal.

7. The device of claim 6, further comprising:
   a third switch configured to adjust a voltage level of an output terminal of the fifth logic element according to the third clock signal; and
   a fourth switch configured to adjust a voltage level of an output terminal of the sixth logic element according to the fourth clock signal.

8. A method, comprising:
   generating a first global write signal based on a first clock signal and a write data signal;
   driving a first memory bank by the first global write signal;
   generating a second global write signal based on a second clock signal and the write data signal;
   driving a second memory bank by the second global write signal;
   generating a third global write signal based on a third clock signal and the write data signal; and
   driving a third memory bank by the third global write signal, wherein the first clock signal, the second clock signal and the third clock signal are different from each other, and the first memory bank, the second memory bank and the third memory bank are different from each other.

9. The method of claim 8, further comprising:

fixing each of the second global write signal and the third global write signal at a ground level when the first global write signal is transmitted to the first memory bank; and fixing each of the first global write signal and the third global write signal at the ground level when the second global write signal is transmitted to the second memory bank.

10. The method of claim 9, further comprising:

fixing each of the second global write signal and the first global write signal at the ground level when the third global write signal is transmitted to the third memory bank.

11. The method of claim 8, further comprising:

determining one of the first memory bank and the second memory bank for performing a write procedure;

when the write procedure is performed to the first memory bank, providing the first clock signal in oscillation to generate the first global write signal according to the write data signal; and when the write procedure is performed to the second memory bank, providing the second clock signal in oscillation to generate the second global write signal according to the write data signal.

12. The method of claim 11, further comprising:

when the write procedure is performed to the first memory bank, suspending the second clock signal from oscillating to maintain the second global write signal at a ground level; and when the write procedure is performed to the second memory bank, suspending the first clock signal from oscillating to maintain the first global write signal at the ground level.

13. A method, comprising:

generating a write signal according to a write data signal inputted to a data latch, a first clock signal and a second clock signal;

generating the second clock signal based on the first clock signal;

generating the first clock signal based on a third clock signal and a fourth clock signal; and operating a plurality of memory banks according to the write signal, the third clock signal and the fourth clock signal, wherein the first clock signal, the second clock signal, the third clock signal and the fourth clock signal are different from each other.

14. The method of claim 13, further comprising:

inputting each of the third clock signal and the fourth clock signal into a first logic element; and outputting the first clock signal by the first logic element.

15. The method of claim 14, wherein generating the second clock signal comprises:

inverting the first clock signal to generate the second clock signal.

16. The method of claim 14, further comprising:

providing a first global word line signal by a second logic element coupled to a first node; and adjusting the first node according to the write signal and the third clock signal.

17. The method of claim 16, wherein adjusting the first node comprises:

receiving the write signal by a third logic element coupled to the first node; and adjusting a power terminal of the third logic element according to the third clock signal.

18. The method of claim 16, further comprising:

providing a second global word line signal by a third logic element coupled to a second node;

inverting the write signal to generate an inverted write signal; and adjusting the second node according to the inverted write signal and the third clock signal, wherein the first global word line signal and the second global word line signal are complementary to each other.

19. The method of claim 18, wherein adjusting the second node comprises:

receiving the inverted write signal by a fourth logic element coupled to the second node; and adjusting a power terminal of the fourth logic element according to the third clock signal.

20. The method of claim 18, further comprising:

controlling, according to the third clock signal, a first switch coupled between a power terminal and the first node; and controlling, according to the third clock signal, a second switch coupled between the power terminal and the second node.

* * * * *